US012793793B2

(12) United States Patent
Zhao

(10) Patent No.: US 12,793,793 B2
(45) Date of Patent: *Nov. 10, 2026

(54) COMPLEMENTARY METAL OXIDE SEMICONDUCTOR CIRCUIT OF MEMORY DEVICE

(71) Applicant: YANGTZE MEMORY TECHNOLOGIES CO., LTD., Wuhan (CN)

(72) Inventor: Lichuan Zhao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 102 days.

This patent is subject to a terminal disclaimer.

(21) Appl. No.: 18/936,422

(22) Filed: Nov. 4, 2024

(65) Prior Publication Data

US 2025/0061952 A1 Feb. 20, 2025

Related U.S. Application Data

(63) Continuation of application No. 18/090,431, filed on Dec. 28, 2022, now Pat. No. 12,165,715, which is a (Continued)

(30) Foreign Application Priority Data

Nov. 25, 2020 (CN) ........................ 202011336570.X

(51) Int. Cl.
*G11C 5/14* (2006.01)
*G11C 16/30* (2006.01)

(52) U.S. Cl.
CPC .................................... *G11C 16/30* (2013.01)

(58) Field of Classification Search
CPC ...................................................... G11C 16/30
(Continued)

(56) References Cited

U.S. PATENT DOCUMENTS 4,533,846 A 8/1985 Simko
4,697,101 A 9/1987 Iwahashi
(Continued)

FOREIGN PATENT DOCUMENTS

CN 1351377 A 5/2002
CN 1885435 A 12/2006
(Continued)

OTHER PUBLICATIONS

First Office action issued in corresponding Chinese Application No. 202011336570.X, mailed on Jun. 22, 2021, 6 pages.
(Continued)

*Primary Examiner* — Viet Q Nguyen
(74) *Attorney, Agent, or Firm* — BAYES PLLC

(57) ABSTRACT

A complementary metal oxide semiconductor (CMOS) circuit includes a high-voltage functional circuit and an auxiliary clamping circuit. The high-voltage functional circuit includes a first metal oxide semiconductor (MOS) transistor. The auxiliary clamping circuit is arranged between an input voltage and a first terminal of the first MOS transistor. The auxiliary clamping circuit includes a first N-type metal oxide semiconductor (NMOS) transistor and a second NMOS transistor coupled in parallel. T first terminal of the first NMOS transistor and a first terminal of the second NMOS transistor are coupled to the input voltage. A second terminal of the first NMOS transistor and a second terminal of the second NMOS transistor are coupled to the first terminal of the first MOS transistor. A gate terminal of the second NMOS transistor is coupled to an output terminal of the high-voltage functional circuit.

20 Claims, 4 Drawing Sheets

Related U.S. Application Data continuation of application No. PCT/CN2021/126779, filed on Oct. 27, 2021.

(58) Field of Classification Search
USPC .......................................................... 365/226
See application file for complete search history.

(56) References Cited

U.S. PATENT DOCUMENTS

| | | | | |
|---|---|---|---|---|
| 4,958,093 | A | 9/1990 | Kosson | |
| 6,166,982 | A | 12/2000 | Murray | |
| 6,172,553 | B1 | 1/2001 | Murray | |
| 6,630,858 | B1 * | 10/2003 | Takabayashi | H02J 50/10 327/540 |
| 6,759,888 | B1 | 7/2004 | Wodnicki | |
| 7,012,456 | B1 | 3/2006 | Hirose | |
| 7,145,370 | B2 | 12/2006 | Bernard | |
| 7,230,470 | B1 | 6/2007 | You | |
| 7,417,880 | B2 * | 8/2008 | Pawel | H03K 17/18 363/56.02 |
| 7,566,935 | B2 * | 7/2009 | Lin | H10D 89/811 257/355 |
| 8,265,569 | B2 | 9/2012 | Barlow | |
| 10,643,695 | B1 * | 5/2020 | Nguyen | G11C 11/5628 |
| 12,165,715 | B2 * | 12/2024 | Zhao | G11C 16/08 |
| 2003/0098714 | A1 | 5/2003 | Clark | |
| 2006/0186942 | A1 | 8/2006 | Futatsuyama et al. | |
| 2008/0054873 | A1 | 3/2008 | Inoue | |
| 2014/0204676 | A1 | 7/2014 | Kim et al. | |
| 2015/0262684 | A1 | 9/2015 | Kutsukake | |
| 2015/0303922 | A1 | 10/2015 | Kwon et al. | |

FOREIGN PATENT DOCUMENTS

| | | | | |
|---|---|---|---|---|
| CN | 102981547 | A | 3/2013 | |
| CN | 103457440 | A | 12/2013 | |
| CN | 203706670 | U | 7/2014 | |
| CN | 106919217 | A | 7/2017 | |
| CN | 106941010 | A | 7/2017 | |
| CN | 110661417 | A | 1/2020 | |
| CN | 112349333 | A * | 2/2021 | G11C 16/30 |
| CN | 114049908 | A * | 2/2022 | G11C 5/147 |
| JP | H06197001 | A | 7/1994 | |
| WO | WO-2022111197 | A1 * | 6/2022 | G11C 16/30 |

OTHER PUBLICATIONS

International Search Report issued in corresponding International Application No. PCT/CN2021/126779, mailed on Jan. 27, 2022, 4 pages.

Written Opinion issued in corresponding International Application No. PCT/CN2021/126779, mailed on Jan. 27, 2022, 5 pages.

* cited by examiner

COMPLEMENTARY METAL OXIDE SEMICONDUCTOR CIRCUIT OF MEMORY DEVICE

CROSS-REFERENCE TO RELATED APPLICATIONS

This application a continuation of U.S. application Ser. No. 18/090,431, filed on Dec. 28, 2022, which is a continuation of International Application No. PCT/CN2021/126779, filed on Oct. 27, 2021, which claims the benefit of priority to Chinese Application No. 202011336570.X, filed on Nov. 25, 2020, all of which are hereby incorporated by reference in their entirety.

BACKGROUND

In recent years, the development of flash memories has been particularly rapid. Flash memories have a main feature that stored information can be maintained for a long time without power on, and have the advantages of high integration, fast access speed, easy erasing and rewriting, etc. Flash memories have been widely used in many fields such as microcomputers and automation control. In order to further increase the bit density of flash memories and reduce the bit cost, three-dimensional flash memory (3D NAND) technology has been rapidly developed.

In a CMOS circuit of the 3D NAND, some functional circuits (such as a switching circuit and a level translation circuit) usually operate under a high voltage, resulting in the deterioration of the hot carrier injection effect of a Metal Oxide Semiconductor (MOS) device due to an excessive drain-source voltage in the rising stage of output voltage, resulting in the reliability risk of such high-voltage functional circuits. In the related art, in order to solve this technical problem, Metal Oxide Semiconductor (MOS) devices with higher performance of high-voltage resistance are usually used to design such high-voltage functional circuits, resulting in such high-voltage functional circuits having a larger area and a smaller current.

SUMMARY

The disclosure relates to the field of integrated circuit design, and particularly to a Complementary Metal Oxide Semiconductor (CMOS) circuit of a memory device, including a high-voltage functional circuit, and an auxiliary clamping circuit.

The high-voltage functional circuit includes at least one MOS transistor. One of a source terminal and a drain terminal of one of the at least one MOS transistor is coupled to an input high-voltage. The high-voltage functional circuit has an output voltage that, when an enable signal is valid, gradually increases and reaches a maximum value.

The auxiliary clamping circuit is arranged between the input high-voltage and the one of the source terminal and the drain terminal of the MOS transistor, and is configured to clamp the voltage input to the one of the source terminal and the drain terminal of the MOS transistor during a rising phase of the output voltage, so that a clamping voltage is smaller than the input high-voltage.

DESCRIPTION OF COMPONENT SIGNS

100 High-voltage functional circuit
200 Auxiliary clamping circuit

DETAILED DESCRIPTION

Hereinafter, specific examples are used to illustrate the implementation of the disclosure, and those in the art may easily understand other advantages and effects of the disclosure from the contents disclosed in this specification. The disclosure may also be implemented or applied through other different implementations, and various details in this specification may also be modified or changed based on different viewpoints and applications without departing from the spirit of the disclosure.

Please refer to FIGS. 1 to 4. It should be noted that the drawings provided in this implementation only illustrate the basic idea of the disclosure in a schematic manner, although the drawings only illustrate components related to the disclosure, rather than drawn according to the number, shape, and size of components in actual implementation, the morphology, number, and proportion of components may be changed at will during actual implementation, and its component layout may also be more complicated.

First Implementation

Figure 1:
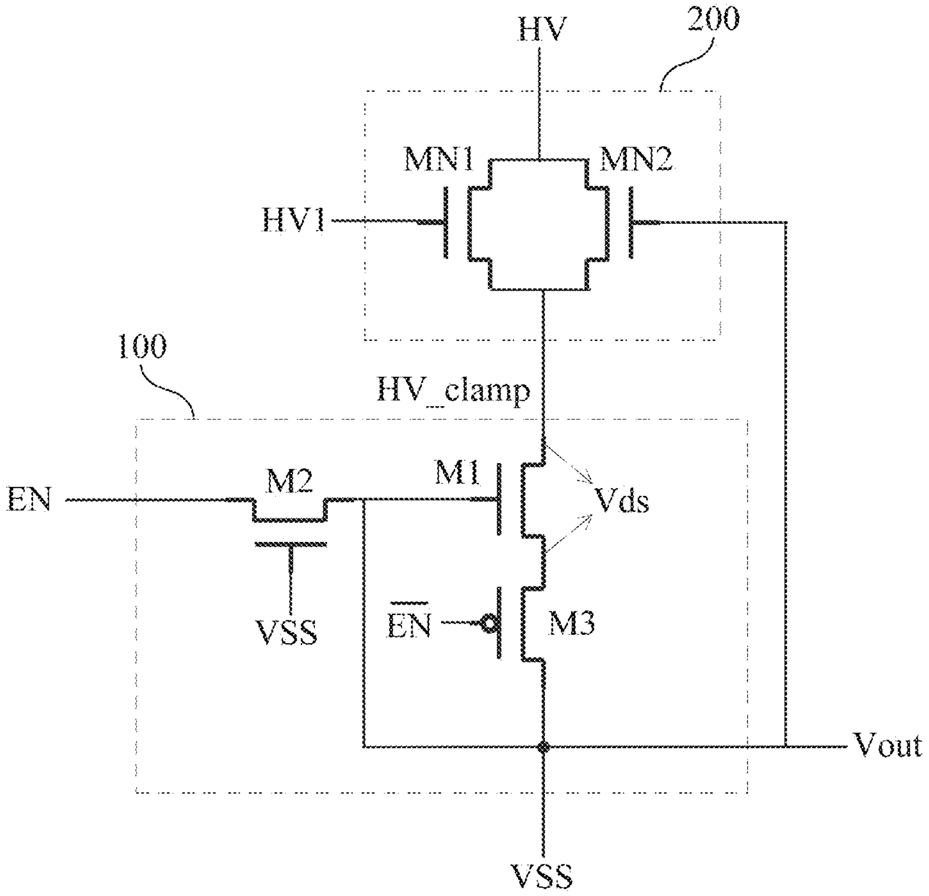
FIG. 1 illustrates a schematic diagram of a CMOS circuit of a memory device according to a first implementation of the disclosure.

As illustrated in FIG. 1, this implementation provides a CMOS circuit of a memory device, including a high-voltage functional circuit 100 and an auxiliary clamping circuit 200.

The high-voltage functional circuit 100 includes at least one MOS transistor. One of a source terminal and a drain terminal of a MOS transistor M1 is coupled to an input high-voltage HV. The high-voltage functional circuit 100 has an output voltage that, when an enable signal is valid, gradually increases and reaches a maximum value HV.

The auxiliary clamping circuit 200 is arranged between the input high-voltage HV and the one of the source terminal and the drain terminal of the MOS transistor M1. The auxiliary clamping circuit 200 is configured to clamp, during a rising phase of the output voltage, a voltage input to the one of the source terminal and the drain terminal of the MOS transistor M1. In this way, a clamping voltage HV_clamp is smaller than the input high-voltage HV.

As an example, the high-voltage functional circuit 100 includes a switching circuit or a level translation circuit. In some examples, the high-voltage functional circuit 100 is a level translation circuit. In the example, the level translation circuit only includes three MOS transistors M1-M3 and the drain terminal of the MOS transistor M1 is coupled to the input high-voltage HV (as illustrated in FIG. 1). In some implementations, level translation circuits of other composition structures are also applicable.

In an implementation, the MOS transistors in the high-voltage functional circuit 100 may be MOS transistors (that is, non-high-voltage MOS transistors) or high-voltage MOS transistors. In the case of MOS transistors, by the design of the auxiliary clamping circuit 200, the CMOS circuit of the memory device described in this implementation can be applicable for high-voltage application scenarios. In the case of high-voltage MOS transistors, by the design of the auxiliary clamping circuit 200, the CMOS circuit of the memory device described in this implementation can be applicable for application scenarios of a higher voltage.

As an example, as illustrated in FIG. 1, the auxiliary clamping circuit 200 includes a first depletion-type high-voltage N-type metal oxide semiconductor (NMOS) transistor MN1 and a second depletion-type high-voltage NMOS transistor MN2. A first connection terminal of the first depletion-type high-voltage NMOS transistor MN1 is connected to a first connection terminal of the second depletion-type high-voltage NMOS transistor MN2 and is coupled to the input high-voltage HV. A second connection terminal of the first depletion-type high-voltage NMOS transistor MN1 is connected to a second connection terminal of the second depletion-type high-voltage NMOS transistor MN2 and is connected to the one of the source terminal and the drain terminal of the MOS transistor M1. A gate terminal of the first depletion-type high-voltage NMOS transistor MN1 is coupled to a preset voltage HV1. A gate terminal of the second depletion-type high-voltage NMOS transistor MN2 is connected to an output terminal of the high-voltage functional circuit 100. The preset voltage HV1 is less than the input high-voltage HV. A threshold voltage of the second depletion-type high-voltage NMOS transistor MN1 is less than zero. In practical applications, the first connection terminal of the first depletion-type high-voltage NMOS transistor MN1 and the first connection terminal of the second depletion-type high-voltage NMOS transistor MN2 may be drain terminals, and the second connection terminal of the first depletion-type high-voltage NMOS transistor MN1 and the second connection terminal of the second depletion-type high-voltage NMOS transistor MN2 may be source terminals.

In an implementation, the preset voltage HV1 is equal to half of the input high-voltage HV, so that the CMOS circuit of the memory device of the disclosure satisfies its own circuit function while having reliability improved as much as possible. Thus, the CMOS circuit of the memory device with such settings may satisfy most of the existing application requirements. In actual applications, the value of the preset voltage HV1 can be set according to specific application scenarios, especially for some special application scenarios. In such cases, the value of the preset voltage HV1 may be greater than half of the input high-voltage HV, or may be less than half of the input high-voltage HV.

In an implementation, the threshold voltage of the first depletion-type high-voltage NMOS transistor MN1 is less than 0, so that the first depletion-type high-voltage NMOS transistor MN1 and the second depletion-type high-voltage NMOS transistor MN2 are completely the same. Thus, the two transistors may be arranged closely in the layout design, which is conducive to reducing the circuit area and facilitating the model selection of devices.

Figure 2:
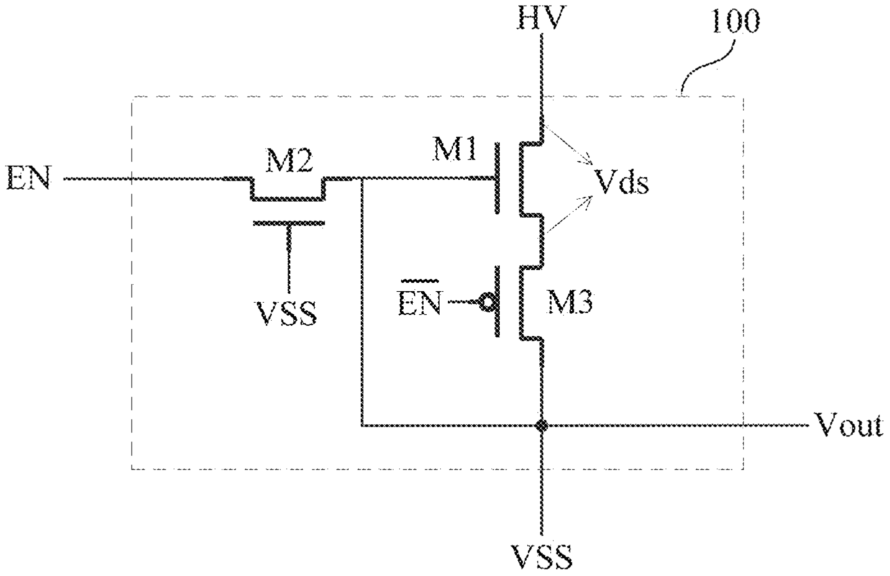
FIG. 2 illustrates a schematic structural diagram of an existing high-voltage functional circuit.
Figure 3:
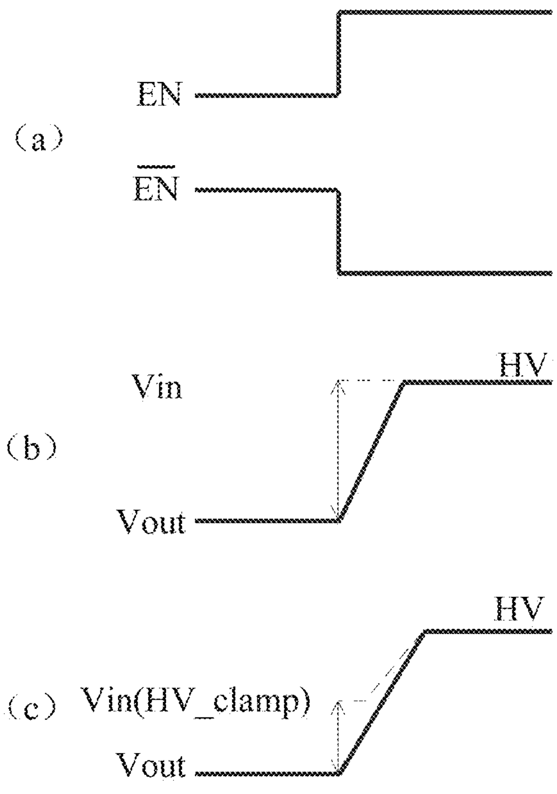
In FIG. 3, (a) illustrates waveform diagrams of an enable signal (EN) and its phase-inverted signal; (b) illustrates a waveform diagram of an output voltage of the existing high-voltage functional circuit under the enable signal and a waveform diagram of a voltage input to a MOS transistor during a rising phase of the output voltage of the existing high-voltage functional circuit; and (c) illustrates a waveform diagram of an output voltage of the CMOS circuit of the memory device in the first implementation under the enable signal and a waveform diagram of a voltage input to the MOS transistor during a rising phase of the output voltage of the CMOS circuit of the memory device in the first implementation.

Referring to FIGS. 1 to 3, the performance of the CMOS circuit of the memory device of this implementation is in combination with an existing high-voltage functional circuit.

As illustrated in FIG. 2 as well as parts (a) and (b) in FIG. 3, for an existing level translation circuit, when the enable signal EN is valid (that is, the enable signal EN changes from a low level to a high level), the output voltage Vout gradually increases and reaches the maximum value HV. However, during the rising phase of the output voltage Vout, since a voltage Vin input to the drain terminal of the MOS transistor M1 is HV, a maximum drain-source voltage Vds of the MOS transistor M1 is (HV−Vth_M1). Vth_M1 is the threshold voltage of the MOS transistor M1. It may be seen that during the rising phase of the output voltage Vout, since the drain-source voltage Vds of the MOS transistor M1 is relatively large, there is a relatively serious hot carrier injection effect, which causes a reliability problem with the level translation circuit. It should be noted that as the output voltage Vout continues to increase, the drain-source voltage Vds of the MOS transistor M1 will continue to decrease; so the circuit reliability problems caused by the hot carrier injection effect mainly occur in the first half time of the rising phase of the output voltage Vout, that is, the initial phase when the enable signal is valid.

As illustrated in FIG. 1 as well as parts (a) and (c) in FIG. 3, with respect to the CMOS circuit of the memory device of the disclosure, when the enable signal EN is valid (that is, the enable signal EN changes from a low level to a high level), the output voltage Vout gradually increases and reaches the maximum value HV. During the rising phase of the output voltage Vout, due to the design of the auxiliary clamping circuit 200 of the disclosure, the voltage Vin input to the drain terminal of the MOS transistor M1 is clamped to the clamping voltage HV_clamp. Therefore, the maximum drain-source voltage Vds of the MOS transistor M1 in such a case is (HV_clamp−Vth_M1). In an implementation, in the first half time of the rising phase of the output voltage Vout, since the output voltage Vout is relatively small, the first depletion-type high-voltage NMOS transistor MN1 in the auxiliary clamping circuit 200 plays a clamping function at this time, and clamps the voltage input to the drain terminal of the MOS transistor M1 to be (HV1−Vth_MN1). During the second half time of the rising phase of the output voltage Vout, that is, when the output voltage Vout is close to the preset voltage HV1, the second depletion-type high-voltage NMOS transistor MN2 in the auxiliary clamping circuit 200 plays a clamping function and clamps the voltage input to the drain terminal of the MOS transistor M1 to be (Vout−Vth_MN2); at this time, the clamping voltage HV_clamp changes following the output voltage Vout. However, since the auxiliary clamping circuit 200 is controlled by the input high-voltage HV, its maximum clamping voltage will not exceed the input high-voltage HV, that is, HV_clamp=min (HV, Vout−Vth_MN2), Vth_MN2<0. Vth_MN1 is the threshold voltage of the first depletion-type high-voltage NMOS transistor MN1, and Vth_MN2 is the threshold voltage of the second depletion-type high-voltage NMOS transistor MN2. It may be seen that during the rising phase of the output voltage Vout, the auxiliary clamping circuit 200 clamps the voltage input to the drain terminal of the MOS transistor M1 to be a clamping voltage HV_clamp that is less than the input high-voltage HV, thereby reducing the drain-source voltage Vds of the MOS transistor M1, reducing its hot carrier injection effect, improving the high-voltage resistance performance of the circuit, improving the reliability of the circuit with a smaller area cost, and making the circuit of the disclosure applicable to an environment of a higher operating voltage. It should be noted that when the output voltage Vout of the high-voltage functional circuit 100 reaches the maximum value HV, the drain-source voltage Vds of the corresponding MOS transistor M1 is very small, and the auxiliary clamping circuit 200 may be regarded as having no voltage loss at this time. That is, during the rising phase of the output voltage Vout, the auxiliary clamping circuit 200 of the disclosure clamps the voltage input to the MOS transistor M1, and after the output voltage Vout reaches the maximum value HV, there is no voltage loss. Moreover, since the auxiliary clamping circuit 200 of the disclosure only functions during the rising phase of the output voltage Vout, the delay caused to the high-voltage functional circuit 100 is very small and may be ignored, that is, the auxiliary clamping circuit has almost no influence on the performance of the high-voltage functional circuit.

Second Implementation

Figure 4:
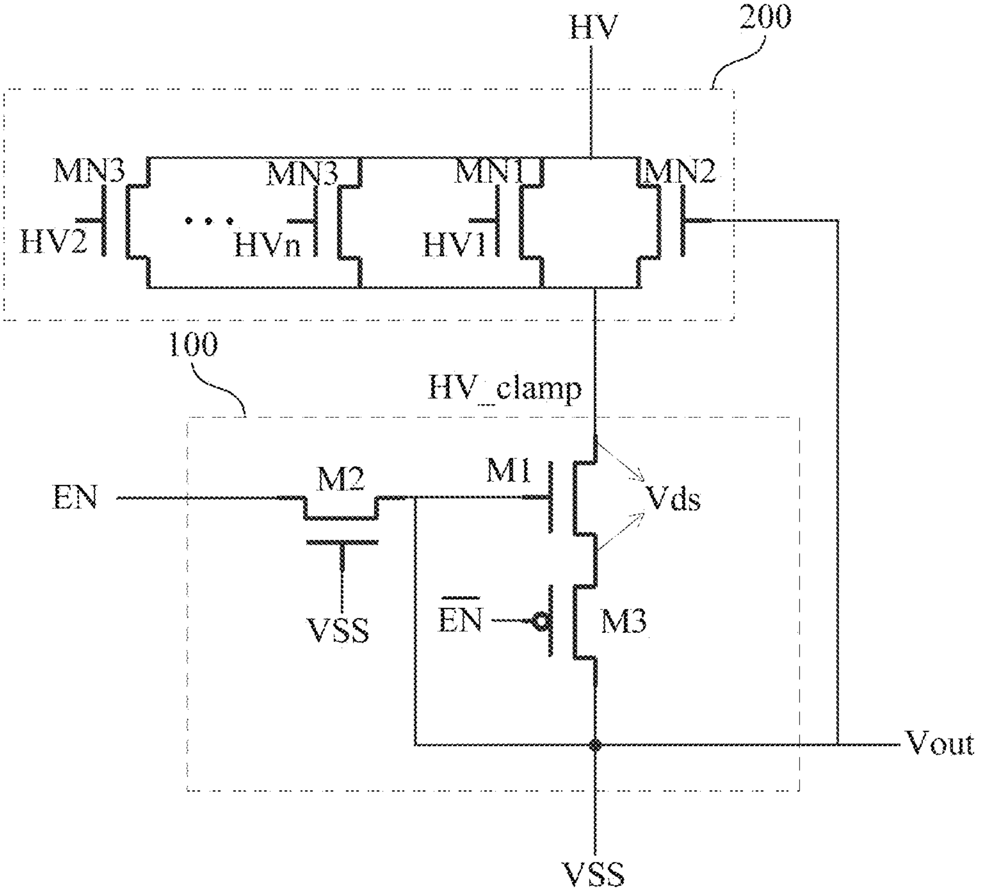
FIG. 4 illustrates a schematic structural diagram of the CMOS circuit of the memory device according to a second implementation of the disclosure.

As illustrated in FIG. 4, the difference between this implementation and the First Implementation is that the auxiliary clamping circuit 200 of this implementation further includes at least one third depletion-type high-voltage NMOS transistor MN3. A first connection terminal of the third depletion-type high-voltage NMOS transistor MN3 is connected to the first connection terminal of the first depletion-type high-voltage NMOS transistor MN1, and a second connection terminal of the third depletion-type high-voltage NMOS transistor MN3 is connected to the second connection terminal of the first depletion-type high-voltage NMOS transistor MN1. A gate terminal of the third depletion-type high-voltage NMOS transistor MN3 is coupled to another preset voltage HV2. The another preset voltage HV2 coupled to the gate terminal of the third depletion-type high-voltage NMOS transistor MN3 is less than the preset voltage HV1 coupled to the gate terminal of the first depletion-type high-voltage NMOS transistor MN1.

As an example, as illustrated in FIG. 4, the at least one third depletion-type high-voltage NMOS transistor includes multiple third depletion-type high-voltage NMOS transistors MN3. First connection terminals of the multiple third depletion-type high-voltage NMOS transistors MN3 are connected to the first connection terminal of the first depletion-type high-voltage NMOS transistor MN1. Second connection terminals of the multiple third depletion-type high-voltage NMOS transistors MN3 are connected to the second connection terminal of the first depletion-type high-voltage NMOS transistor MN1. Gate terminals of the multiple third depletion-type high-voltage NMOS transistors MN3 are coupled to preset voltages (HV2–HVn) respectively. Values of the preset voltages (HV2–HVn) successively increase, and the preset voltage HVn with the largest value is less than the preset voltage HV1 coupled to the gate terminal of the first depletion-type high-voltage NMOS transistor MN1. In practical applications, the first connection terminal of the first depletion-type high-voltage NMOS transistor MN1, the first connection terminal of the second depletion-type high-voltage NMOS transistor MN2, and the first connection terminals of the third depletion-type high-voltage NMOS transistors MN3 may be drain terminals; and the second connection terminal of the first depletion-type high-voltage NMOS transistor MN1, the second connection terminal of the second depletion-type high-voltage NMOS transistor MN2, and the second connection terminals of the third depletion-type high-voltage NMOS transistors MN3 may be source terminals. In the disclosure by the design of at least one third depletion-type high-voltage NMOS transistor MN3, the objective of accurately controlling the clamping voltage HV_clamp may be achieved. The greater the number of third depletion-type high-voltage NMOS transistors MN3 in the design, the more accurate the control of the clamping voltage HV_clamp is, that is, the closer the clamping voltage HV_clamp is to the real value.

In an implementation, the preset voltage HV1 coupled to the gate terminal of the first depletion-type high-voltage NMOS transistor MN1 is equal to half of the input high-voltage HV, so that the CMOS circuit of the memory device of the disclosure satisfies its own circuit function while having the reliability improved as much as possible, so that the CMOS circuit of the memory device with such settings may satisfy most of the existing application requirements. In actual applications, the value of the preset voltage HV1 needs to be set according to specific application scenarios, especially for some special application scenarios. In such cases, the value of the preset voltage HV1 may be greater than half of the input high-voltage HV, or may be less than half of the input high-voltage HV.

In an implementation, the threshold voltage of the first depletion-type high-voltage NMOS transistor MN1 is less than 0, and the threshold voltage of the third depletion-type high-voltage NMOS transistor MN3 is less than 0, so that the first depletion-type high-voltage NMOS transistor MN1, the second depletion-type high-voltage NMOS transistor MN2 and the third depletion-type high-voltage NMOS transistors MN3 are exactly the same. In this way, these transistors may be arranged closely in the layout design, which is conducive to reducing the circuit area and facilitating the model selection of devices.

In summary, in the CMOS circuit of the memory device of the disclosure, without modifying the existing high-voltage functional circuit, only by adding an auxiliary clamping circuit at the high-voltage input terminal of the existing high-voltage functional circuit, the voltage input to the MOS transistor in the high-voltage functional circuit is clamped to a clamping voltage less than the input high-voltage in the rising stage of the output voltage. The drain-source voltage of the MOS transistor is reduced, and the hot carrier injection effect is reduced. The performance of the high-voltage resistance of the circuit is improved. The objective of improving the reliability of the circuit at a small area cost is realized, and the performance of the memory device is improved. Therefore, various shortcomings in the related art have been effectively overcome in the disclosure, so the disclosure has a high industrial value in use.

The above implementations only exemplarily illustrate the principles and effects of the disclosure, and are not used to limit the disclosure. Anyone familiar with this technology can modify or change the above implementations without departing from the spirit and scope of the disclosure. Therefore, all equivalent modifications or changes made by persons with ordinary knowledge in the art without departing from the spirit and technical ideas disclosed in the disclosure should still be covered by the claims of the disclosure.

The invention claimed is:

1. A complementary metal oxide semiconductor (CMOS) circuit, comprising:

a high-voltage functional circuit comprising a first metal oxide semiconductor (MOS) transistor; and an auxiliary clamping circuit, arranged between an input voltage and a first terminal of the first MOS transistor, wherein the auxiliary clamping circuit comprises a first N-type metal oxide semiconductor (NMOS) transistor and a second NMOS transistor coupled in parallel, a first terminal of the first NMOS transistor and a first terminal of the second NMOS transistor are coupled to the input voltage, a second terminal of the first NMOS transistor and a second terminal of the second NMOS transistor are coupled to the first terminal of the first MOS transistor, a gate terminal of the second NMOS transistor is coupled to an output terminal of the high-voltage functional circuit.

2. The CMOS circuit of claim 1, wherein a gate terminal of the first NMOS transistor is configured to receive a first preset voltage, the first preset voltage being less than the input voltage.

3. The CMOS circuit of claim 1, wherein a threshold voltage of the second NMOS transistor is less than zero.

4. The CMOS circuit of claim 2, wherein the first preset voltage is equal to half of the input voltage.

5. The CMOS circuit of claim 1, wherein a threshold voltage of the first NMOS transistor is less than zero.

6. The CMOS circuit of claim 2, wherein:

the auxiliary clamping circuit further comprises at least one third NMOS transistor, the third NMOS transistor being coupled in parallel with the first NMOS transistor; and a gate terminal of the third NMOS transistor is configured to receive a second preset voltage, and the second preset voltage is less than the first preset voltage.

7. The CMOS circuit of claim 2, wherein:

the auxiliary clamping circuit further comprises third NMOS transistors;

gate terminals of the third NMOS transistors are configured to receive corresponding third preset voltages; and each of the third preset voltages is less than the first preset voltage.

8. The CMOS circuit of claim 7, wherein the third preset voltages received by first terminals of the third NMOS transistors gradually increase along a direction close to the second NMOS transistor.

9. The CMOS circuit of claim 7, wherein a threshold voltage of each third NMOS transistor is less than zero.

10. The CMOS circuit of claim 1, wherein:

the high-voltage functional circuit further comprises a second MOS transistor;

a first terminal of the second MOS transistor is coupled to a gate terminal of the first MOS transistor; and a second terminal of the second MOS transistor is configured to receive an enable signal.

11. The CMOS circuit of claim 10, wherein:

the high-voltage functional circuit further comprises a third MOS transistor coupled in series to the first MOS transistor;

a second terminal of the first MOS transistor is coupled to a first terminal of the third MOS transistor; and a second terminal of the third MOS transistor is coupled between the first terminal of the second MOS transistor and the gate terminal of the first MOS transistor as the output terminal of the high-voltage functional circuit.

12. The CMOS circuit of claim 11, wherein:

the second MOS transistor is a N-type MOS transistor;

the third MOS transistor is a P-type MOS transistor; and a gate terminal of the third MOS transistor is configured to receive a signal inverted to the enable signal.

13. A memory device, comprising:

a memory array; and a peripheral circuit coupled to the memory array, wherein the peripheral circuit comprises:

a high-voltage functional circuit comprising a first metal oxide semiconductor (MOS) transistor; and an auxiliary clamping circuit, arranged between an input voltage and a first terminal of the first MOS transistor, wherein the auxiliary clamping circuit comprises a first N-type metal oxide semiconductor (NMOS) transistor and a second NMOS transistor coupled in parallel, a first terminal of the first NMOS transistor and a first terminal of the second NMOS transistor are coupled to the input voltage, a second terminal of the first NMOS transistor and a second terminal of the second NMOS transistor are coupled to the first terminal of the first MOS transistor, and a gate terminal of the second NMOS transistor is coupled to an output terminal of the high-voltage functional circuit.

14. A circuit, comprising:

a functional circuit comprising an input terminal configured to input a clamping voltage, and an output terminal configured to output an output voltage; and a clamping circuit comprising a first transistor and a second transistor coupled in parallel, wherein a first terminal of the first transistor and a first terminal of the second transistor are coupled with each other and coupled to an input voltage, a gate terminal of the first transistor is coupled to a preset voltage, a gate terminal of the second transistor is coupled to the output terminal, a second terminal of the first transistor and a second terminal of the second transistor are coupled with each other and coupled to the input terminal, and the preset voltage is less than the input voltage.

15. The circuit of claim 14, wherein the output voltage increases and reaches a voltage equal to the input voltage in a rising phase when the functional circuit is enabled by an enable signal.

16. The circuit of claim 15, wherein:

the functional circuit comprises a third transistor;

a gate terminal of the third transistor is coupled to the enable signal, a first terminal of the third transistor is coupled to the second terminal of the first transistor; and a second terminal is coupled to the output terminal.

17. The circuit of claim 15, wherein in a first period of the rising phase of the output voltage, the clamping voltage is associated with the preset voltage.

18. The circuit of claim 17, wherein in a second period after the first period of the rising phase of the output voltage, the clamping voltage is associated with the output voltage.

19. The circuit of claim 14, wherein the preset voltage is equal to half of the input voltage.

20. The circuit of claim 14, wherein a threshold voltage of the first transistor is less than zero, and a threshold voltage of the second transistor is less than zero.

* * * * *